(12) United States Patent
Hwang et al.

(10) Patent No.: US 8,218,362 B2
(45) Date of Patent: Jul. 10, 2012

(54) MAGNETIC RANDOM ACCESS MEMORY DEVICES, METHODS OF DRIVING THE SAME AND DATA WRITING AND READING METHODS FOR THE SAME

(75) Inventors: In-jun Hwang, Yongin-si (KR); Sun-ae Seo, Hwaseong-si (KR); Kee-won Kim, Chungcheongnam-do (KR); Kwang-seok Kim, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 204 days.

(21) Appl. No.: 12/385,124

(22) Filed: Mar. 31, 2009

(65) Prior Publication Data

US 2009/0251956 A1 Oct. 8, 2009

(30) Foreign Application Priority Data

Apr. 3, 2008 (KR) .................. 10-2008-0031364
Oct. 10, 2008 (KR) .................. 10-2008-0099777
Mar. 25, 2009 (KR) .................. 10-2009-0025547

(51) Int. Cl.
*G11C 11/14* (2006.01)
*G11C 11/416* (2006.01)
*G11C 29/82* (2006.01)

(52) U.S. Cl. . 365/171; 365/148; 365/100; 365/189.011; 257/421; 257/E29.323

(58) Field of Classification Search ........................ None
See application file for complete search history.

(56) References Cited

U.S. PATENT DOCUMENTS 6,396,671 B1 * 5/2002 Horng et al. ............... 360/324.1
(Continued)

FOREIGN PATENT DOCUMENTS

JP 2007-59879 * 3/2007
KR 2007-0066118 6/2007

OTHER PUBLICATIONS

G. D. Fuchs et al., "Adjustable Spin Torque in Magnetic Tunnel Junctions With Two Fixed Layers," Applied Physics Letters, No. 86, 152509, Apr. 6, 2005.

(Continued)

*Primary Examiner* — Hoai V Ho
*Assistant Examiner* — James G Norman
(74) *Attorney, Agent, or Firm* — Harness, Dickey & Pierce, P.L.C.

(57) ABSTRACT

A magnetic memory device includes a lower structure or an antiferromagnetic layer, a pinned layer, an information storage layer, and a free layer formed on the lower structure or the antiferromagnetic layer. In a method of operating a magnetic memory device, information from the storage information layer is read or stored after setting the magnetization of the free layer in a first magnetization direction. The information is stored when the first magnetization direction is opposite to a magnetization direction of the pinned layer, but is read when the first magnetization direction is the same as the magnetization direction of the pinned layer.

26 Claims, 8 Drawing Sheets

U.S. PATENT DOCUMENTS

| | | |
|---|---|---|
| 6,842,368 B2 | 1/2005 | Hayakawa |
| 7,057,921 B2 | 6/2006 | Valet |
| 7,241,631 B2 | 7/2007 | Huai et al. |
| 7,411,817 B2 * | 8/2008 | Nozieres et al. ............. 365/158 |
| 7,750,421 B2 * | 7/2010 | Horng et al. .................. 257/421 |
| 2004/0136231 A1 * | 7/2004 | Huai et al. .................... 365/158 |
| 2007/0025029 A1 | 2/2007 | Hayakawa et al. |
| 2007/0096229 A1 * | 5/2007 | Yoshikawa et al. ........... 257/421 |
| 2007/0254188 A1 | 11/2007 | Hayakawa et al. |

OTHER PUBLICATIONS

Yiming Huai et al., "Spin Transfer Switching Current Reduction in Magnetic Tunnel Junction Based Dual Spin Filter Structures," Applied Physics Letters, No. 87, 222510, Nov. 23, 2005.

Hao Meng et al., "Low Critical Current for Spin Transfer in Magnetic Tunnel Junctions," Applied Physics Letters, No. 88, 082504, Feb. 23, 2006.

* cited by examiner

MAGNETIC RANDOM ACCESS MEMORY DEVICES, METHODS OF DRIVING THE SAME AND DATA WRITING AND READING METHODS FOR THE SAME

PRIORITY STATEMENT

This application claims priority under 35 U.S.C. §119 to Korean Patent Application No. 10-2008-0031364, filed on Apr. 3, 2008, Korean Patent Application No. 10-2008-0099777, filed on Oct. 10, 2008, and Korean Patent Application No. 10-2009-0025547, filed on Mar. 25, 2009 in the Korean Intellectual Property Office, the entire contents of which is incorporated herein by reference.

BACKGROUND

1. Field

Example embodiments relate to magnetic memory devices, methods of driving the same and data writing and reading methods for the same, and more particularly, to magnetic memory devices that may minimize or reduce magnetoresistance (MR) reduction and/or may reduce critical current density (Jc), methods of driving the same and data writing and reading methods for the same.

2. Description of the Related Art

As the information industry develops, the processing of relatively large amounts of information is required. Thus, the demand for data storing media capable of storing relatively large amounts of information is continuously increasing. As the demand for the data storing media increases, studies about relatively small-sized information storing media having relatively high data storing speed have been conducted. As a result of these studies, various kinds of information storing apparatuses have been developed.

Information storing apparatuses are either volatile information storing apparatuses or non-volatile information storing apparatuses. In the case of the volatile information storing apparatuses, stored information is erased when power is turned off. Volatile information storing apparatuses have higher writing and reading speeds than non-volatile information storing apparatuses. In the case of the non-volatile information storing apparatuses, stored information is not erased even though power is turned off.

A dynamic random access memory (DRAM) IS an example of a conventional volatile information storing apparatus. A hard disk drive (HDD) and a random access memory (RAM) are examples of conventional non-volatile information storing apparatuses. A magnetic random access memory (MRAM), which is a type of volatile information storing apparatuses, uses a magneto-resistance effect based on a spin dependent electron transport phenomenon.

Conventional magnetic memory devices switch a magnetization direction of a free layer of a memory cell using a magnetic field generated by a current flowing through a bit line and a word line of the conventional magnetic memory devices. However, this method has the following drawbacks.

When the size of a unit cell is reduced to realize a relatively high-density memory device, the coercivity of the free layer increases. As a result, a switching field increases. Thus, the magnitude of an applied current may be increased. Moreover, because a relatively large number of memory cells are included in a memory array structure, free layers of unwanted cells may switch. Thus, conventional magnetic memory devices that switch using the magnetic field have relatively low selectivity and may hardly realize high-density memory devices.

Magnetic memory devices that use a spin transfer torque (STT) phenomenon may address the above-discussed drawbacks of high density, selectivity, and high writing current, and thus, many studies have been conducted on magnetic memory devices using the STT phenomenon. In this conventional method, a free layer of the magnetic memory device is switched to a desired direction using a spin transfer of electrons by allowing a current in which spins are polarized in a direction to flow in the magnetic memory device. This conventional method is advantageous for realizing a relatively high density because the required current is relatively small as the cell size decreases. However, the critical current density required for switching the magnetic memory devices that use the STT phenomenon is too large for the magnetic memory devices to be commercialized, and thus, studies have been conducted to reduce the critical current density of the magnetic memory devices that use the STT phenomenon.

Various methods of reducing the critical current density have been proposed as follows.

In one example, a critical current required for switching may be decreased by increasing a polarization factor of an input current. However, the polarization factor is a basic property of a material, and thus, polarization factor is rarely increased. Alternatively, a multiple layer structure may be used.

FIG. 1 is a cross-sectional view of a structure of a conventional magnetic memory device.

Referring to FIG. 1, the conventional magnetic memory device includes a first anti-ferro-magnetic layer 101, a first pinned layer 102, a first non-magnetic layer 103, and a free layer 104 sequentially formed on a substrate 100. A second non-magnetic layer 105, a second pinned layer 106, and a second anti-ferro-magnetic layer 107 are sequentially formed on the free layer 104. The magnetization direction of the first pinned layer 102 is fixed in a first direction by the first anti-ferro-magnetic layer 101, while the magnetization direction of the second pinned layer 106 is fixed in a second direction by the second anti-ferro-magnetic layer 107. The magnetization direction of the free layer 104 may be changed in an arbitrary direction. The first non-magnetic layer 103 is formed of Cu. The first pinned layer 102, the first non-magnetic layer 103, and the free layer 104 have a conventional giant magneto-resistance (GMR) structure.

The second non-magnetic layer 105 is formed of Al, and the free layer 104, the second non-magnetic layer 105, and the second pinned layer 106 have a tunneling magneto-resistance (TMR) structure.

It has been reported that a dual spin filter structure in which a GMR structure and a TMR structure are connected to each other may have a lower critical current density relative to the critical current density of the simple GMR structure and the TMR structure. However, in the dual spin filter structure, the first and second pinned layers 102 and 106 may be arranged in opposite directions, and thus, there is a problem in that the magnetoresistance (MR) disappears. Also, in order to reduce the critical current density of the dual spin structure, the first and second non-magnetic layers 103 and 105 (having different resistances from each other) may be formed or the magnetization direction of the second pinned layer 106 may be arranged in a perpendicular direction to the first pinned layer 102, not in an opposite direction. Regardless, however, compensating for reduced MR is relatively difficult.

SUMMARY

Example embodiments relate to at least one of magnetic random access memory devices, for example, magnetic random access memory devices that suppress and/or minimize the reduction of magnetoresistance (MR) and/or reduce critical current density (Jc), data writing and reading methods for the same, and a method of driving the magnetic memory device to write and read information.

Example embodiments provide magnetic memory devices having a structure in which a critical current density of the magnetic memory device may be reduced while suppressing and/or minimizing a magnetoresistance (MR).

According to at least one example embodiment, a magnetic memory device including a pinned layer, an information storage layer, and a free layer formed on a lower structure.

According to at least some example embodiments, an anti-ferro-magnetic layer may be arranged between the lower structure and the pinned layer. The pinned layer may have a magnetization direction fixed by the anti-ferro-magnetic layer. A first non-magnetic layer may be arranged between the pinned layer and the information storage layer. A second non-magnetic layer may be arranged between the information storage layer and the free layer. The free layer may be formed on the second non-magnetic layer such that the magnetization direction of the free layer is changeable.

According to at least some example embodiments, the first and second non-magnetic layers may be formed of MgO or the like. The lower structure may be a switch (e.g., transistor) structure. The magnetic memory device may further include a bit line, an interlayer insulating layer, and a writing line formed sequentially on the free layer.

According to at least some example embodiments, the magnetic memory device may further include a magnetic layer formed on the free layer. The magnetic layer may include at least two domains having magnetization directions different from each other.

According to at least some example embodiments, a magnetic memory device may include an antiferromagnetic layer, a pinned layer on the antiferromagnetic layer, an information storage layer on the pinned layer, and a free layer on the information storage layer.

The magnetization direction of the pinned layer may be pinned by the antiferromagnetic layer, and the magnetic memory device may further include a first non-magnetic layer formed on the pinned layer, wherein the information storage layer is formed on the first non-magnetic layer, and a second non-magnetic layer, wherein the free layer is formed on the second non-magnetic layer such that the magnetization direction of the free layer is changeable.

At least one of the information storage layer, the pinned layer and the free layer may have a synthetic antiferromagnetic (SAF) structure. The SAF structure may include a first ferromagnetic layer, an intermediate layer, and a second ferromagnetic layer. The intermediate layer may comprise any one selected from the group consisting of Ru, Cr, and Cu. Each of the first and second non-magnetic layers may comprise MgO. The antiferromagnetic layer may have a switch structure. The magnetic memory device may further include a bit line, an interlayer insulating layer, and a write line sequentially formed on the free layer. The magnetic memory device may further include a magnetic layer formed on the free layer and including at least two domains whose magnetization directions are different from each other.

At least one other example embodiment provides an information writing and reading method for a magnetic memory device including a pinned layer, an information storage layer, and a free layer formed on a lower structure. According to at least this example embodiment, information may be written to the information storage layer after setting the magnetization direction of the free layer in a direction opposite to that of the pinned layer. Information may be read from the information storage layer after setting the magnetization direction of the free layer in the same direction as that of the pinned layer.

At least one other example embodiment provides a method of operating a magnetic memory device. According to at least this example embodiment, information from the storage information layer may be read or stored after setting the magnetization of the free layer in a first magnetization direction. The information may be stored when the first magnetization direction is opposite to a magnetization direction of the pinned layer, but read when the first magnetization direction is the same as the magnetization direction of the pinned layer.

According to at least some example embodiments, a writing line may be formed on the free layer, and the magnetization direction of the free layer may change due to a magnetic field generated by a current applied to the writing line.

According to at least some other example embodiments, a magnetic layer may be formed on the free layer. The magnetic layer may include at least two domains. Each of the domains may have a different magnetization direction. The magnetization direction of the free layer may change after moving a domain wall of the magnetic layer.

According to at least some other example embodiments, a method of driving a magnetic memory device includes a pinned layer, an information storage layer having an SAF structure, and a free layer, to write and read information, the method including writing information to the information storage layer by aligning the magnetization of the free layer in the same direction as the magnetization direction of the pinned layer; and reading information from the information storage layer by aligning the magnetization of the free layer in a direction opposite to the magnetization direction of the pinned layer.

The magnetic memory device may further include a write line formed on the free layer, and the method may further include changing the magnetization direction of the free layer due to a magnetic field generated by current supplied to the write line. The magnetic memory device may further include a magnetic layer formed on the free layer and including at least two domains whose magnetization directions are different from each other, and the method may further include changing the magnetization direction of the free layer after moving a domain wall of the magnetic layer.

According to example embodiments, a method of driving a magnetic memory device includes a pinned layer, an information storage layer having an SAF structure, and a free layer to write and read information, and the method may further include writing information to the information storage layer by aligning the magnetization of the free layer in the same direction as the magnetization direction of the pinned layer; and reading information from the information storage layer by aligning the magnetization of the free layer in a direction opposite to the magnetization direction of the pinned layer.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Figure 1:
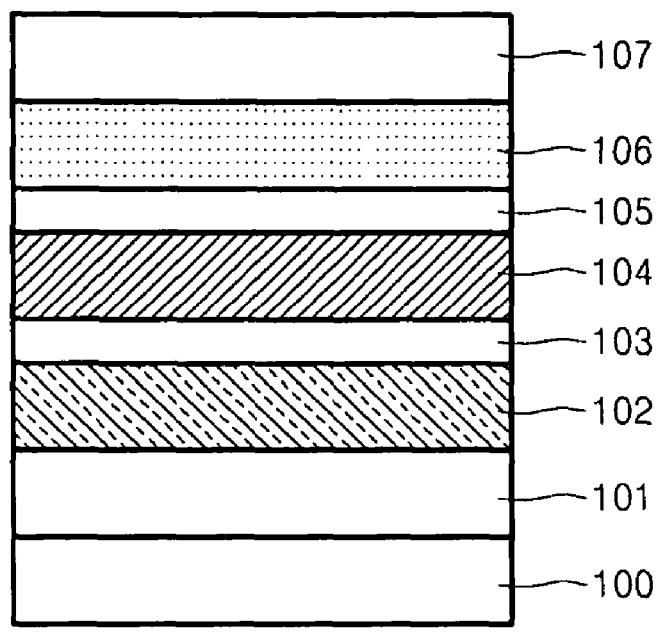
FIG. 1 is a cross-sectional view of a structure of a conventional magnetic memory device.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

Further, it will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

Further still, it will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
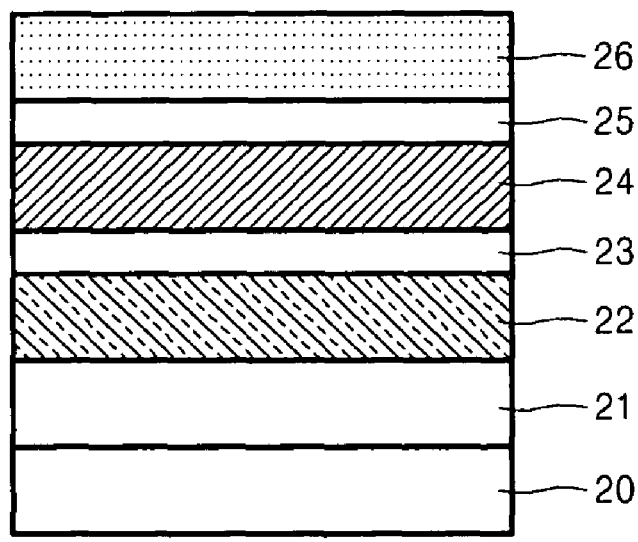
FIG. 2 is a cross-sectional view of a structure of a magnetic memory device according to an example embodiment.

FIG. 2 is a cross-sectional view of a structure of a magnetic memory device according to an example embodiment.

Referring to FIG. 2, an example embodiment of a magnetic memory device may include an anti-ferro-magnetic layer 21, a pinned layer 22, a first non-magnetic layer 23, and an information storage layer 24 formed sequentially on a lower structure 20. A second non-magnetic layer 25 and a free layer 26 may be formed sequentially on the information storage layer 24.

The lower structure 20 may be a switching device or an electrode connected to the switching device. The switching device may be a transistor structure or the like. The anti-ferromagnetic layer 21 may be formed of an alloy, for example, IrMn, FeMn, NiMn, or the like, which may contain Mn (e.g., mostly or mainly Mn). The pinned layer 22 may be formed of NiFe, CoFe or the like. The magnetization direction of the pinned layer 22 may be fixed in a direction by the anti-ferromagnetic layer 21. The first non-magnetic layer 23 and the second non-magnetic layer 25 may be formed of MgO or the like. The information storage layer 24 and the free layer 26 may be formed of a ferro-magnetic material such as NiFe, CoFe, or the like. The magnetization directions of the information storage layer 24 and the free layer 26 may be changed (e.g., changeable or variable).

A method of operating (e.g., reading and/or writing information to) a magnetic memory device according to an example embodiment will now be described.

In a method of writing information according to an example embodiment, the free layer 26 may have magnetization direction opposite to the magnetization direction of the pinned layer 22. As a result, the pinned layer 22 under the information storage layer 24 may have a magnetization direction in a first direction, whereas the free layer 26 on the information storage layer 24 may have a magnetization direction in a second direction. The magnetization direction of the information storage layer 24 may be arranged in the first direction or the second direction by applying a spin-polarized current to the information storage layer 24. Thus, information regarding the first direction or the second direction may be stored in the information storage layer 24. Thus, the critical current density required for a writing operation may be reduced to about half in accordance with example embodiments.

In a method of reading information according to an example embodiment, the magnetization direction of the free layer 26 may be the same direction as the magnetization direction of the pinned layer 22. A resistance of the information storage layer 24 may be measured by applying a current to both ends of the information storage layer 24. If the magnetization direction of the information storage layer 24 is the same as that of the pinned layer 22, a relatively low resistance (representing a first type of information, e.g., binary 1 or 0) is measured. If the magnetization direction of the information storage layer 24 is opposite to the magnetization of the pinned layer 22, a relatively high resistance (representing a second type of information, e.g., binary 1 or 0) is measured. Thus, data recorded in the information storage layer 24 may be read.

Magnetic memory devices according to at least this example embodiment may include the information storage layer 24 and the free layer 26 arranged on the pinned layer 22. Magnetic memory devices according to example embodiments may perform information storing and reading processes by changing the magnetization direction of the free layer 26. Thus, magnetic memory devices according to at least some example embodiments may reduce (e.g., greatly reduce) the critical current density while suppressing and/or minimizing the reduction of magnetoresistance (MR).

Example embodiments of methods of changing the magnetization direction of the free layer 26 will now be described.

According to at least one example embodiment, a writing line may be formed on the free layer 26. The magnetization direction of the free layer 26 may be controlled using a magnetic field generated in the writing line when a current is applied to the writing line. The free layer 26 may have a relatively low coercive force Hc that changes the magnetization direction of the free layer 26 due to an external magnetic field. The information storage layer 24 may have a coercive force Hc greater than that of the free layer 26. A structure of the magnetic memory device including a writing line is shown in FIG. 3.

Figure 3:
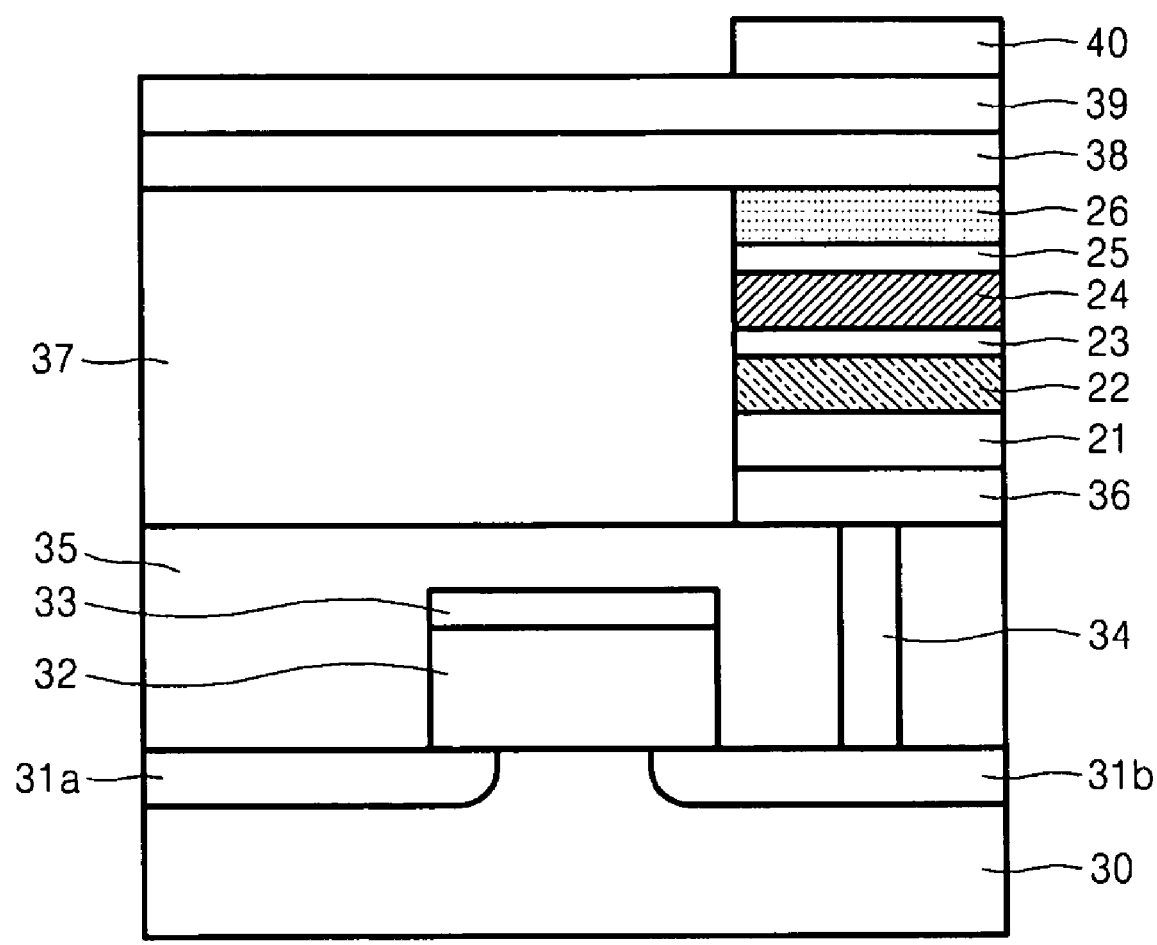
FIG. 3 is a cross-sectional view of a structure of the magnetic memory device connected to a transistor according to an example embodiment.

FIG. 3 is a cross-sectional view of a structure of the magnetic memory device connected to a transistor according to an example embodiment.

Referring to FIG. 3, a transistor structure including a gate insulating layer 32 and a gate electrode 33 may be formed on a substrate 30. The substrate 30 may include a source 31*a* and a drain 31*b* formed therein. A first interlayer insulating layer 35 may be formed on the transistor structure. A contact plug 34 may be formed in a region of (e.g., a hole through) a first interlayer insulating layer 35. The contact plug 34 may correspond to and contact the drain 31*b*. A lower electrode 36 may be formed on the contact plug 34. A multilayer structure or film may be formed on the lower electrode 36. The multilayer film may include the anti-ferro-magnetic layer 21, the pinned layer 22, the first non-magnetic layer 23, the information storage layer 24, the second non-magnetic layer 25, and the free layer 26 formed sequentially. A second interlayer insulating layer 37 may be formed on a side of the multilayer structure. A bit line 38 may be formed on the free layer 26. A third interlayer insulating layer 39 may be formed on the bit line 38. A writing line 40 may be formed on the third interlayer insulating layer 39. The writing line 40 may correspond (e.g., in size) to the free layer 26.

A magnetic field may be generated according to the direction of the current flowing in the writing line 40. The magnetization direction of the free layer 26 may change according to the generated magnetic field.

According to at least one other example embodiment, a method of changing the magnetization direction of the free layer 26 uses a domain wall motion phenomenon. In this example, a magnetic layer having magnetization directions different from each other may be formed on the free layer 26, and a domain having a desired magnetization direction may be moved toward the free layer 26. The magnetic layer may have a first portion and a second portion, each of which may have a different magnetization. The first and second portions may be separated by a domain wall. Subsequently, the domain having a desired magnetization direction may be moved into the free layer 26. An example structure of a magnetic memory device according to an example embodiment including the magnetic layer having magnetization directions different from each other is shown in FIG. 4.

Figure 4:
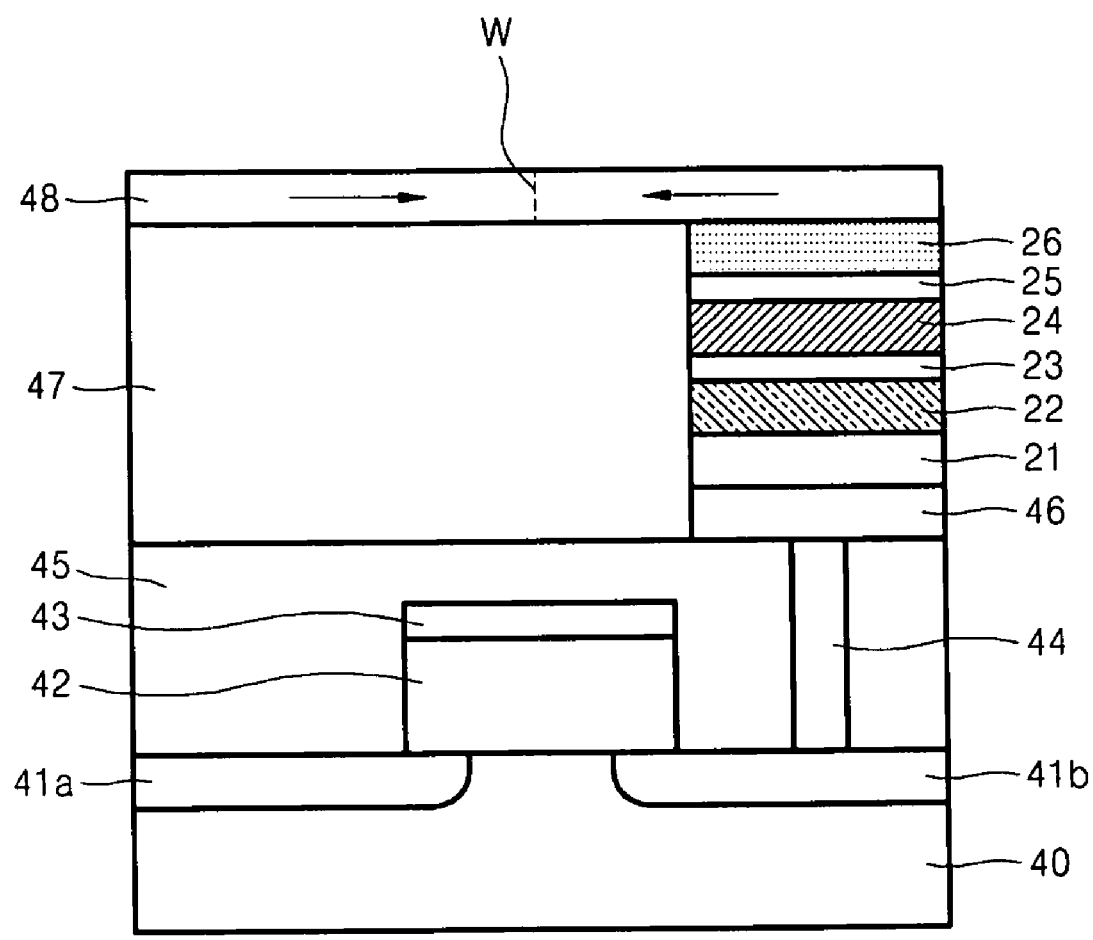
FIG. 4 is a cross-sectional view of a structure of the magnetic memory device connected to a transistor according to another example embodiment.

FIG. 4 is a cross-sectional view of a structure of the magnetic memory device according to another example embodiment. The magnetic memory device shown in FIG. may be connected to a transistor.

Referring to FIG. 4, a substrate 40 including a source 41*a* and a drain 41*b* may be prepared. A gate insulating layer 42 and a gate electrode 43 may be formed on the substrate 40. The gate insulating layer 42 may be formed to contact parts of the source 41*a* and the drain 41*b*. A first interlayer insulating layer 45 may be formed on the transistor structure. A contact plug 44 may be formed in a region of the first interlayer insulating layer 45. The contact plug 44 may correspond to and contact the drain 41*b*. A lower electrode 46 may be formed on the contact plug 44. A multilayer film may be formed on the lower electrode 46. The multilayer structure or film may include the anti-ferro-magnetic layer 21, the pinned layer 22, the first non-magnetic layer 23, the information storage layer 24, the second non-magnetic layer 25, and the free layer 26 formed sequentially. A second interlayer insulating layer 47 may be formed on a side of the multilayer structure. The magnetic layer 48 including domains having different magnetization directions from each other may be formed on the free layer 26 and the second interlayer insulating layer 47. A domain wall W may be formed between the domains. The domain wall W has a characteristic of moving in a direction opposite to the direction in which the electrons move; in the direction of current flow.

An example embodiment of a method of magnetizing the free layer 26 in a right direction (the direction of the left portion of the magnetic layer 48 in FIG. 4) will now be described.

Still referring to FIG. 4, the domain wall W in the magnetic layer 48 may be moved toward a right side (in the right direction) of the free layer 26 by applying a current to the magnetic layer 48. The domain wall W may be moved such that a domain having a magnetization direction in the right direction may be positioned on (e.g., entirely on) the free layer 26. For example, the domain having the right magnetization direction may be positioned to cover the upper surface of the free layer 26. Afterwards, the domain of the magnetic layer 48 may be moved to the free layer 26 by applying a current to a left side of the magnetic layer 48 and the free layer 26.

To magnetize the free layer 26 in a left direction (the direction of the right portion of the magnetic layer 48 in FIG. 4), the domain wall W of the magnetic layer 48 may be moved toward a left side (in the right direction) of the free layer 26 by applying a current to the magnetic layer 48. The domain wall W may be moved such that a domain of the magnetic layer 48 having a magnetization direction in the left direction is positioned on (e.g., entirely on) the free layer 26. For example, the domain having the left magnetization direction may be positioned to cover the upper surface of the free layer 26. The domain of the magnetic layer 48 may be moved to the free layer 26 by applying a current to the right side of the magnetic layer 48 and the free layer 26.

Figure 5:
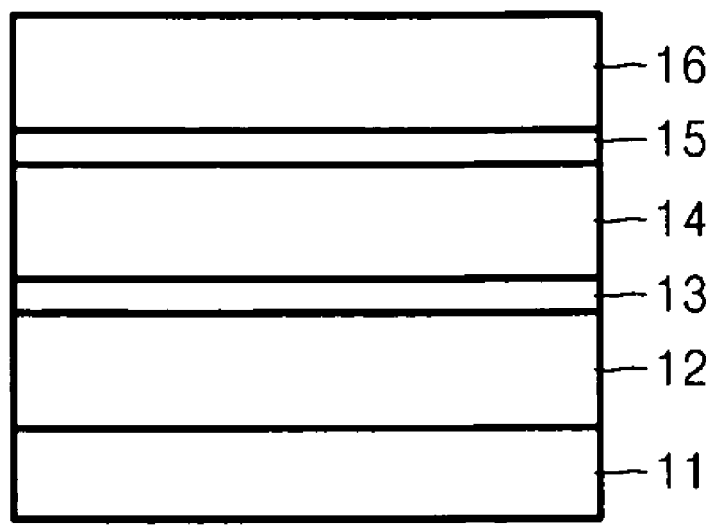
FIG. 5 is a cross-sectional view of a magnetic memory device according to another example embodiment.

FIG. 5 is a cross-sectional view of a magnetic memory device according to an example embodiment. Referring to FIG. 5, a pinned layer 12, a first non-magnetic layer 13, and an information storage layer 14 are sequentially formed on an antiferromagnetic layer 11. A second non-magnetic layer 15 and a free layer 16 are sequentially formed on the information storage layer 14.

Materials used to form the layers of the magnetic memory device of FIG. 5 will now be explained. The antiferromagnetic layer 11 is usually formed of an alloy containing Mn. For example, the antiferromagnetic layer 11 may be formed of IrMn, FeMn, or NiMn. The antiferromagnetic layer 11 may be formed on a switching element or an electrode connected to the switching element. The switching element may be a transistor structure. The pinned layer 12, whose magnetization direction is pinned by the antiferromagnetic layer 11, is formed of a ferromagnetic material containing Ni, Co, or Fe. For example, the pinned layer 12 may be formed of NiFe, CoFe, NiFeB, CoFeB, NiFeSiB, or CoFeSiB. Each of the first non-magnetic layer 13 and the second non-magnetic layer 15 may be formed of MgO. Each of the information storage layer 14 and the free layer 16 whose magnetization directions are changeable may be formed of a ferromagnetic material containing Ni, Co, or Fe. For example, each of the information storage layer 14 and the free layer 16 may be formed of NiFe, CoFe, NiFeB, CoFeB, NiFeSiB, or CoFeSiB.

Figure 7A:
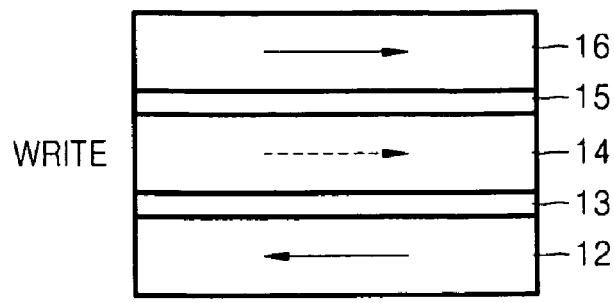
FIGS. 7A and 7B are cross-sectional views respectively illustrating methods of driving the magnetic memory devices of FIGS. 5 and 6, according to example embodiments.
Figure 7A:
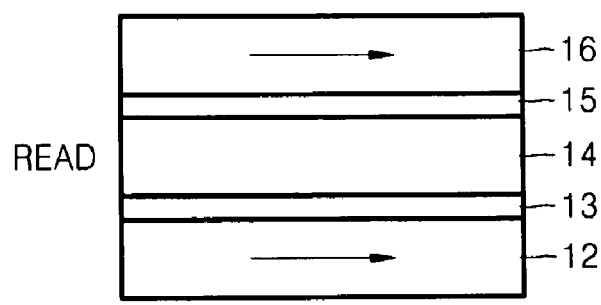

A method of driving the magnetic memory device of FIG. 5 to write and read information will now be explained with reference to FIG. 7A in detail. FIG. 7A is a cross-sectional view illustrating a method of driving the magnetic memory device of FIG. 5, according to an example embodiment. A write operation will be first explained. In order to align the magnetization of the free layer in a direction opposite to the magnetization direction of the pinned layer 12, an external magnetic field or an external electric field is applied. In example embodiments, the magnetization of the pinned layer 12 is aligned in a first direction and the magnetization of the free layer 16 is aligned in a second direction.

Spin-polarized electrons are applied to the information storage layer 14 in one direction from the pinned layer 12 or the free layer 16. If spin-polarized electrons are applied from the pinned layer 12, the magnetization of the information storage layer 14 is aligned in the first direction, and if spin-polarized electrons are applied from the free layer 16, the magnetization of the information storage layer 14 is aligned in the second direction. In FIG. 7A, spin-polarized electrons are applied from the free layer 16 to the information storage layer 14. Accordingly, information may be stored in the information storage layer 14 in the first direction or the second direction. Accordingly, critical current density necessary for the write operation may be reduced.

A read operation will now be explained. The magnetization of the free layer 16 is aligned in the same direction as the magnetization direction of the pinned layer 12. Current is supplied to the information storage layer 14 and the resistance of the information storage layer 14 is measured. If the magnetization direction of the information storage layer 14 is the same as that of each of the pinned layer 12 and the free layer 16, a relatively low resistance is measured. If the magnetization direction of the information storage layer 14 is opposite to that of each of the pinned layer 12 and the free layer 16, a relatively high resistance is measured. Accordingly, stored data represented by the magnetization direction of the information storage layer 14 may be read.

As a result, because the information storage layer 14 and the free layer 16 are formed on the pinned layer 12, the magnetic memory device of FIG. 5 may minimize magnetoresistance (MR) reduction and may significantly reduce critical current density by changing the magnetization direction of the free layer 16 to store and reproduce information.

Figure 6:
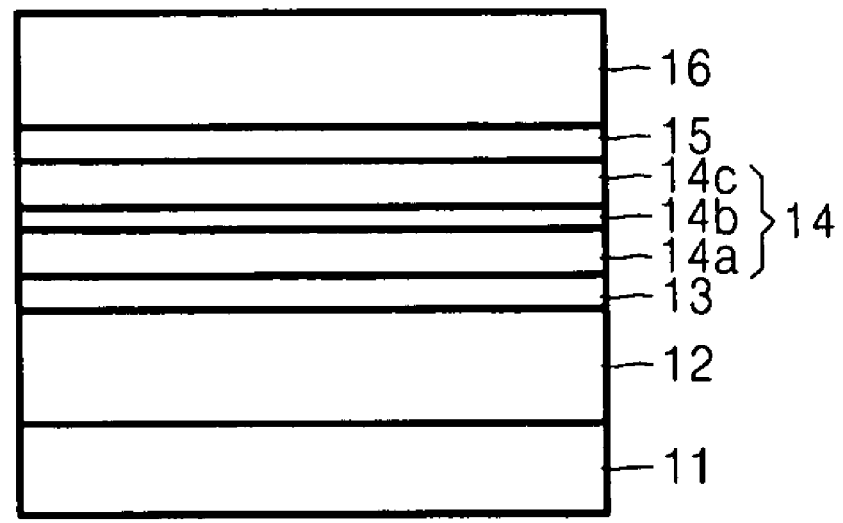
FIG. 6 is a cross-sectional view of a magnetic memory device according to another example embodiment.

FIG. 6 is a cross-sectional view of a magnetic memory device, including the information storage layer 14 having a synthetic antiferromagnetic (SAF) structure, according to another example embodiment. Referring to FIG. 6, the pinned layer 12, the first non-magnetic layer 13, and the information storage layer 14 are formed on the antiferromagnetic layer 11. The second non-magnetic layer 15 and the free layer 16 are sequentially formed on the information storage layer 14. The information storage layer 144 has an SAF structure. That is, the information storage layer 14 may be structured such that a first magnetic layer 14a, an intermediate layer 14b, and a second magnetic layer 14c are sequentially formed. Because the information storage layer 14 has the SAF structure, high stability against a magnetic field may be maintained.

Figure 7B:
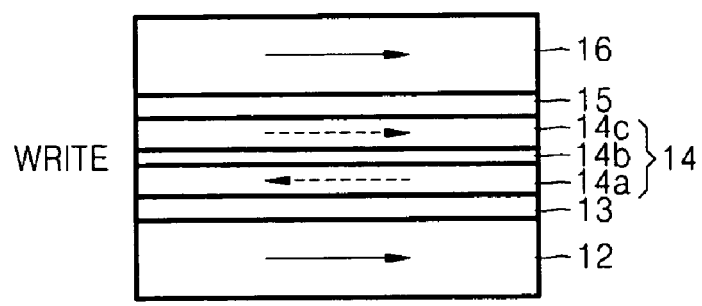
Figure 7B:
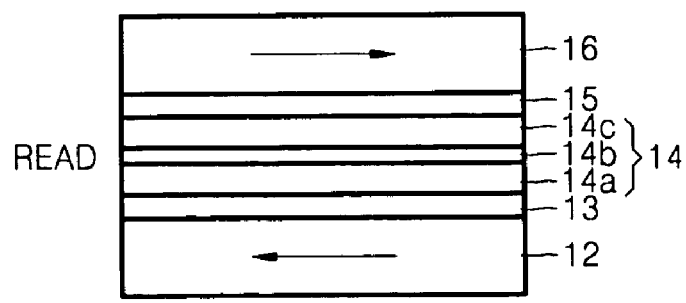

A method of driving the magnetic memory device of FIG. 6 to write and read information will now be explained with reference to FIG. 7B. FIG. 7B is a cross-sectional view illustrating a method of driving the magnetic memory device of FIG. 6, according to an example embodiment.

A write operation will be first explained. The magnetization of the free layer 16 is aligned in the first direction that is the same as the magnetization direction of the pinned layer 12. Spin-polarized electrons are applied to the information storage layer 14 from the pinned layer 12 or the free layer 16. If spin-polarized electrons are applied to the information storage layer 14 from the pinned layer 12, the magnetization of the first magnetic layer 14a of the information storage layer 14 is aligned in the first direction, and the magnetization of the second magnetic layer 14c of the information storage layer 14 is aligned in the second direction. If spin-polarized electrons are applied to the information storage layer 14 from the free layer 16, the magnetization of the second magnetic layer 14c of the information storage layer 14 is aligned in the first direction and the magnetization of the first magnetic layer 14a of the information storage layer 14 is aligned in the second direction. In FIG. 7B, spin-polarized electrons are applied to the information storage layer 14 from the free layer 16.

A read operation will now be explained. The magnetization of the free layer 16 is aligned in a direction opposite to the magnetization direction of the pinned layer 12. For example, the magnetization of the free layer 16 is aligned in the first direction and the magnetization of the pinned layer 12 is aligned in the second direction. Current is supplied to the information storage layer 14 and resistance is measured. For example, if the magnetization directions of the free layer 16 and the second magnetic layer 14c are the first direction, a relatively low resistance is measured. In example embodiments, because the magnetization directions of the pinned layer 12 and the first magnetic layer 14a are the same, a relatively low resistance is also measured between the pinned layer 12 and the first magnetic layer 14a. However, if the magnetization directions of the free layer 16 and the second magnetic layer 14c are opposite to each other and if the magnetization directions of the pinned layer 12 and the first magnetic layer 14a are opposite to each other, a relatively high resistance is measured. Accordingly, stored data represented by the magnetization direction of the information storage layer 14 may be read.

As a result, because the information storage layer 14 and the free layer 16 are formed on the pinned layer 12, the magnetic memory device of FIG. 6 may minimize or reduce MR reduction and may reduce critical current density by changing the magnetization direction of the free layer 16 to store and reproduce information. Not only the information storage layer 14 but also the pinned layer 12 or the free layer 16 may have an SAF structure.

Figure 8:
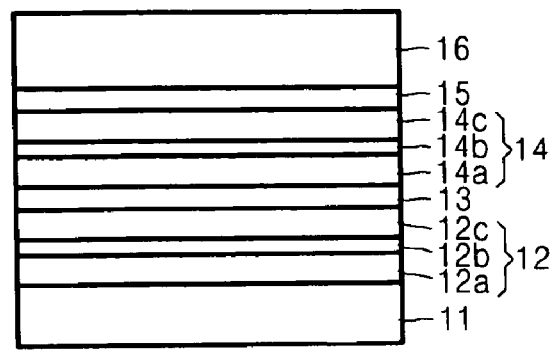
FIG. 8 is a cross-sectional view of a magnetic memory device, including a pinned layer and an information storage layer each having a synthetic antiferromagnetic (SAF) structure, according to another example embodiment.

FIG. 8 is a cross-sectional view of a magnetic memory device including the information storage layer 14 and the pinned layer 12 each having an SAF structure according to another example embodiment. Referring to FIG. 8, the pinned layer 12 having an SAF structure is formed on the antiferromagnetic layer 11. The first non-magnetic layer 13 is formed on the pinned layer 12. The information storage layer 14 having an SAF structure is formed on the first non-magnetic layer 13. The second non-magnetic layer 15 and the free layer 16 are formed on the information storage layer 14. The pinned layer 12 includes a first pinned magnetic layer 12a, an intermediate layer 12b, and a second pinned magnetic layer 12c. The magnetization directions of the first pinned magnetic layer 12a and the second pinned magnetic layer 12c are kept opposite to each other.

Figure 9:
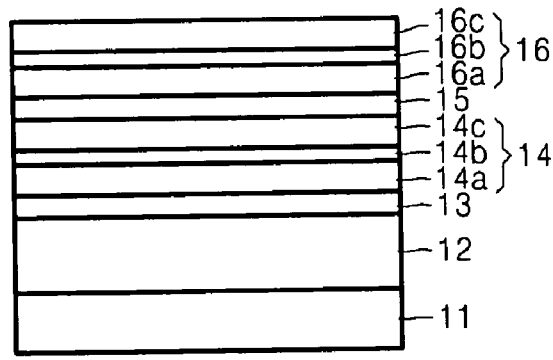
FIG. 9 is a cross-sectional view of a magnetic memory device, including an information storage layer and a free layer each having an SAF structure, according to another example embodiment.

FIG. 9 is a cross-sectional view of a magnetic memory device including the information storage layer 14 and the free layer 16 each having an SAF structure according to another example embodiment. Referring to FIG. 9, the pinned layer 12 is formed on the antiferromagnetic layer 11. The first non-magnetic layer 13 is formed on the pinned layer 12. The information storage layer 14 having an SAF structure is formed on the first non-magnetic layer 13. The second non-magnetic layer 15 and the free layer 16 having an SAF structure are formed on the information storage layer 14. The free layer 16 includes a first free magnetic layer 16a, an intermediate layer 16b, and a second free magnetic layer 16c. The magnetization directions of the first free magnetic layer 16a and the second free magnetic layer 16c are kept opposite to each other.

Figure 10:
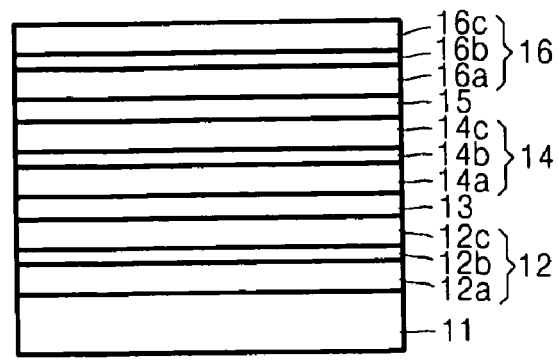
FIG. 10 is a cross-sectional view of a magnetic memory device, including a pinned layer, an information storage layer, and a free layer each having an SAF structure, according to another example embodiment.

FIG. 10 is a cross-sectional view of a magnetic memory device, including the pinned layer 12, the information storage layer 14, and the free layer 16 each having an SAF structure, according to another example embodiment. Referring to FIG. 10, the pinned layer 12 having an SAF structure is formed on the antiferromagnetic layer 11. The first non-magnetic layer 13 is formed on the pinned layer 12. The information storage layer 14 having an SAF structure is formed on the first non-magnetic layer 13. The second non-magnetic layer 15 and the free layer 16 having an SAF structure are formed on the information storage layer 14.

If the information storage layer 14 has an SAF structure, a stable magnetization direction against an external magnetic field may be achieved. If each of the pinned layer 12 and the information storage layer 14 has an SAF structure, a stray field may be reduced and the free layer 16 may be more easily controlled. The thicknesses of the first and second pinned magnetic layers 12a and 12c of the pinned layer 12 may be equal to each other and the thicknesses of the first and second magnetic layers 14a and 14c of the information storage layer 14 may be equal to each other, in order to offset net moments. If the free layer 16 has an SAF structure, a coercive force Hc may be controlled. The thicknesses of the first and second free magnetic layers 16a and 16c of the free layer 16 may be different from each other in order to react net moments with an external magnetic field.

Materials used to form the layers of each of the magnetic memory devices of FIGS. 8-10 will now be explained. The antiferromagnetic layer 11 is usually formed of an alloy containing Mn. For example, the antiferromagnetic layer 11 may be formed of IrMn, FeMn, or NiMn. The antiferromagnetic layer 11 may be formed on a switching element or an electrode connected to the switching element. The switching element may be a transistor structure. The pinned layer 12, whose magnetization direction is pinned by the antiferromagnetic layer 11, is formed of a ferromagnetic material containing Ni, Co, or Fe. For example, the pinned layer 12 may be formed of NiFe, CoFe, NiFeB, CoFeB, NiFeSiB, or CoFeSiB. The free layer 16, whose magnetization direction is changeable, may be formed of a ferromagnetic material, e.g., NiFe or CoFe.

The first pinned magnetic layer 12a and the second pinned magnetic layer 12c of the pinned layer 12, the first magnetic layer 14a and the second magnetic layer 14c of the information storage layer 14, and the first free magnetic layer 16a and the second free magnetic layer 16c of the free layer 16 may be formed of a ferromagnetic material containing Ni, Co, or Fe. For example, the first pinned magnetic layer 12a and the second pinned magnetic layer 12c of the pinned layer 12, the first magnetic layer 14a and the second magnetic layer 14c of the information storage layer 14, and the first free magnetic layer 16a and the second free magnetic layer 16c of the free layer 16 may be formed of NiFe, CoFe, NiFeB, CoFeB, NiFeSiB, or CoFeSiB. The intermediate layers 12b, 14b, and 16b may be formed of Ru, Cr, or Cu.

A method of changing the magnetization direction of the free layer 16 of each of the magnetic memory devices of FIGS. 5 and 6 will now be explained. A first method of changing the magnetization direction of the free layer 16 involves forming a write line on the free layer 16, flowing current through the write line to generate a magnetic field, and adjusting the magnetization direction of the free layer 16 using the magnetic field. The free layer 16 may have a coercive force Hc low enough to change its magnetization direction according to an external magnetic field. The information storage layer 14 may have a coercive force greater than that of the free layer 16. A magnetic memory device including such a write line is illustrated in FIG. 11.

Figure 11:
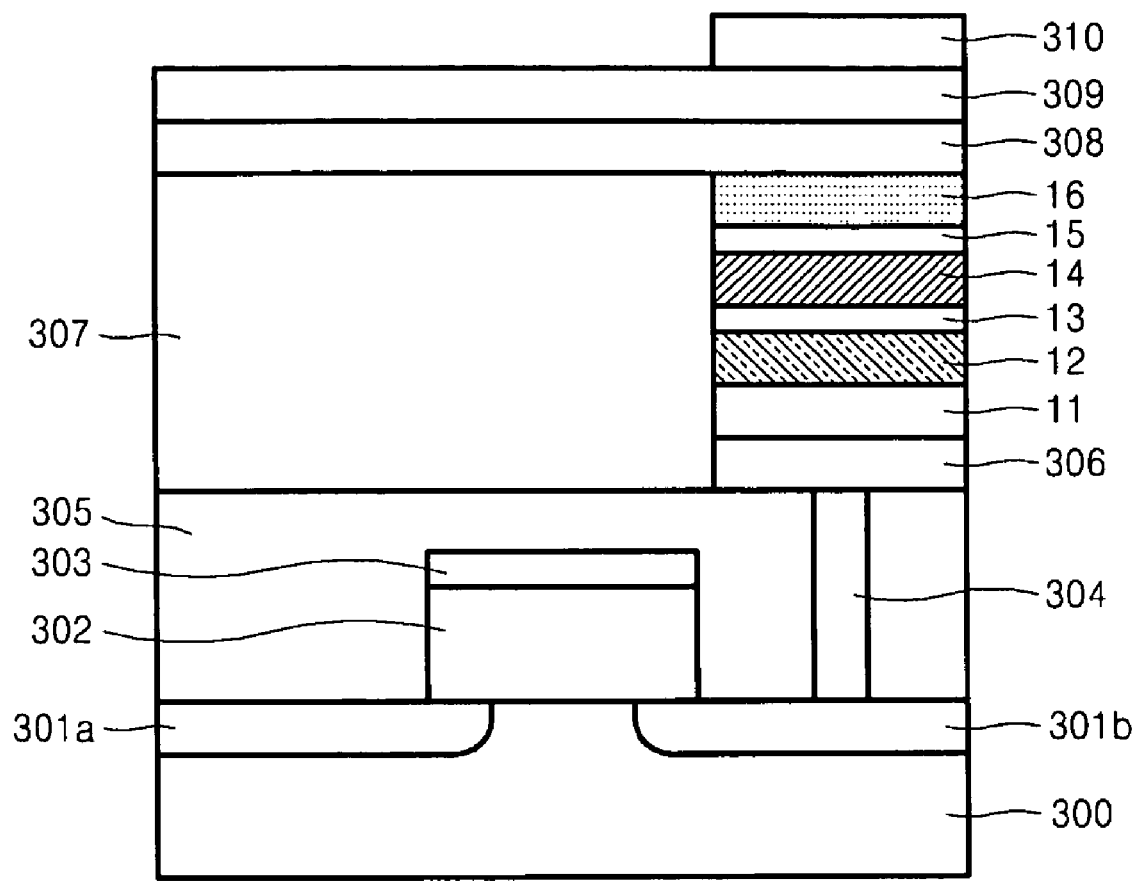
FIGS. 11 and 12 are cross-sectional views of magnetic memory devices according to other example embodiments.

FIG. 11 is a cross-sectional view of a magnetic memory device, according to another example embodiment. Referring to FIG. 11, a transistor structure including a gate insulating layer 302 and a gate electrode 303 is formed on a substrate 300 including a source 301a and a drain 301b. A first interlayer insulating layer 305 is formed on the transistor structure, and a contact plug 304 is formed in the first interlayer insulating layer 305 to correspond to the drain 301b. A lower electrode 306 is formed on the contact plug 304, and a multi-layer structure including the anti-ferromagnetic layer 11, the pinned layer 12, the first non-magnetic layer 13, the information storage layer 14, the second non-magnetic layer 15, and the free layer 16 which are sequentially stacked is formed on the lower electrode 306. A second interlayer insulating layer 307 is formed beside the multi-layer structure. A bit line 308 is formed on the free layer 16, and a third interlayer insulating layer 309 is formed on the bit line 308. A protective layer (not shown) for protecting the free layer 16 may be optionally formed between the free layer 16 and the bit line 308.

A write line 310 is formed on the third interlayer insulating layer 309 to correspond to the free layer 16. Each of the pinned layer 12, the information storage layer 14, and the free layer 16 may have an SAF structure. A magnetic field may be generated according to a direction in which current flows through the write line 310, and the magnetization direction of the free layer 16 may be changed by the generated magnetic field. For reference, if the information storage layer 14 has an SAF structure and the free layer 16 has a single-layer structure, the information storage layer 14 may be formed to have a magnetization easy axis of about 30° to about 60° with respect to the bit line 308 in order to reduce the influence of a change in the magnetization direction of the free layer 16 on the magnetization direction of the information storage layer 14.

A second method of changing the magnetization direction of the free layer 16 is to use domain wall motion. The second method involves forming a magnetic layer having different magnetization directions on the free layer 16 and moving a domain having a desired magnetization direction into the free layer 16. A magnetic memory device including such a magnetic layer having different magnetization directions is illustrated in FIG. 12.

Figure 12:
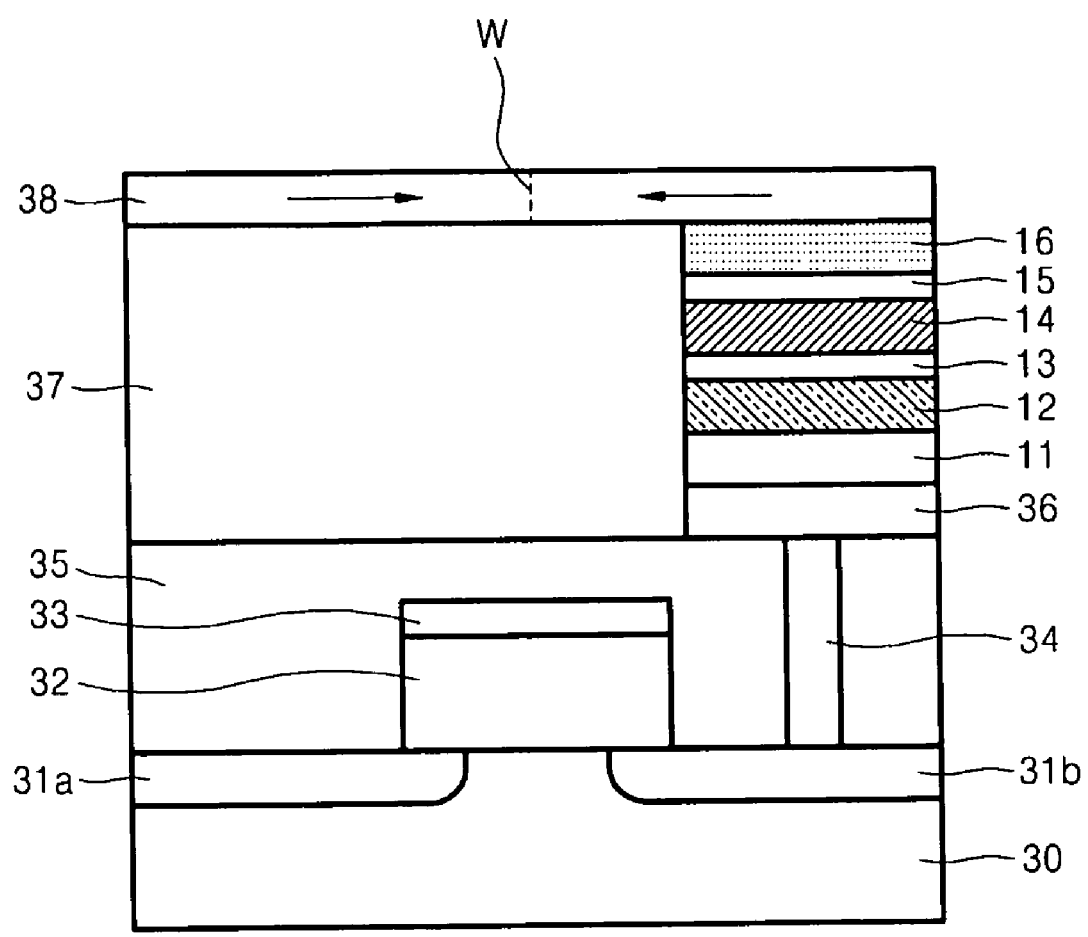

FIG. 12 is a cross-sectional view of a magnetic memory device according to another example embodiment. Referring to FIG. 12, a substrate 30 includes a source 31a and a drain 31b, and a transistor structure including a gate insulating layer 32 and a gate electrode layer 33 is formed on the substrate 30 to contact the source 31a and the drain 31b. A first interlayer insulating layer 35 is formed on the transistor structure, and a contact plug 34 is formed in the first interlayer insulating layer 35 to correspond the drain 31b. A lower electrode 36 is formed on the contact plug 34, and a multi-layer structure including the antiferromagnetic layer 11, the pinned layer 12, the first non-magnetic layer 13, the information storage layer 14, the second non-magnetic layer 15, and the free layer 16 sequentially stacked is formed on the lower electrode 36. A second interlayer insulating layer 37 is formed beside the multi-layer structure. A magnetic layer 38 including domains having different magnetization directions are formed on the free layer 16 and the second interlayer insulating layer 37. Each of the pinned layer 12, the information storage layer 14, and the free layer 16 may have an SAF structure.

The magnetic layer 38 may include domains having magnetization directions which are opposite to each other, and there is a domain wall W between the domains. The domain wall W is moved in the direction of electron flow that is opposite to the direction of current flow. For example, if a magnetization direction needs to be a magnetization direction towards the right, current is supplied to the magnetic layer 38 to move the domain wall W toward the right on the free layer 16. Accordingly, the domain having the right magnetization direction is located on the free layer 16. Current is supplied to the left side of the magnetic layer 38 and to the free layer 16 to move the domain of the magnetic layer 38 to the free layer 16. If a magnetization direction needs to be a magnetization direction towards the left, current is supplied to the magnetic layer 38 to move the domain wall W toward the left on the free layer 16. Accordingly, the domain having the left magnetization direction is located on the free layer 16. Then, current is supplied to the right side of the magnetic layer 38 and to the free layer 16 to move the domain of the magnetic layer 38 to the free layer 16.

As a result, according to example embodiments, because the magnetic memory layer aligns the magnetization of the free layer in a direction identical or opposite to the magnetization direction of the pinned layer, information may be written to or read from the information storage layer and critical current density may be reduced (e.g., greatly reduced) compared to a conventional magnetic memory device. Because information is stored and reproduced by changing the magnetization direction of the free layer, MR reduction may be minimized and critical current density may be reduced. Because the information storage layer has an SAF structure, the magnetic memory device may be stable against an external magnetic field.

In addition, magnetic memory devices according to example embodiments may write information in an information storage layer or may read information from the information storage layer by controlling the magnetization direction of a free layer to be the same or opposite to that of a fixed layer. As a result, a critical current density in the writing and reading processes may be reduced (e.g., greatly reduced) as compared to a conventional magnetic memory device.

While example embodiments have been shown and described with reference to example embodiments thereof, it should not be construed as being limited to such embodiments. For example, the magnetic memory device according to the embodiments may further include a buffer layer, an underlayer, and an overlayer which are optional. Those skilled in this art know, for example, magnetic memory devices according to example embodiments may further include a buffer layer, an under layer, and/or a capping layer as an option. Therefore, the scope is not defined by the detailed description of example embodiments, but by the appended claims.

What is claimed is:

1. A magnetic memory device comprising:
   a pinned layer, an information storage layer, and a free layer formed sequentially on a lower structure; wherein the magnetic memory device is configured to write information to the information storage layer by applying spin polarized electrons from the free layer to the information storage layer.

2. The magnetic memory device of claim 1, further comprising:
   an anti-ferro-magnetic layer arranged between the lower structure and the pinned layer, the anti-ferro-magnetic layer fixing a magnetization direction of the pinned layer;
   a first non-magnetic layer arranged between the pinned layer and the information storage layer;
   a second non-magnetic layer arranged between the information storage layer and the free layer, the free layer being arranged on the second non-magnetic layer such that a magnetization direction of the free layer is changeable.

3. The magnetic memory device of claim 2, wherein the first and second non-magnetic layers are formed of MgO.

4. The magnetic memory device of claim 1, wherein the lower structure is a switch structure.

5. The magnetic memory device of claim 1, further comprising:
   a bit line, an interlayer insulating layer, and a writing line formed sequentially on the free layer.

6. The magnetic memory device of claim 1, further comprising:
   a magnetic layer formed on the free layer, the magnetic layer including at least two domains having magnetization directions different from each other.

7. A magnetic memory device comprising:
   an antiferromagnetic layer;
   a pinned layer on the antiferromagnetic layer;
   an information storage layer on the pinned layer; and
   a free layer on the information storage layer; wherein the magnetic memory device is configured to write information to the information storage layer by applying spin polarized electrons from the free layer to the information storage layer.

8. The magnetic memory device of claim 7, wherein the magnetization direction of the pinned layer is pinned by the antiferromagnetic layer, the magnetic memory device further comprising:
   a first non-magnetic layer formed on the pinned layer, wherein the information storage layer is formed on the first non-magnetic layer; and
   a second non-magnetic layer, wherein the free layer is formed on the second non-magnetic layer such that a magnetization direction of the free layer is changeable.

9. The magnetic memory device of claim 8, wherein at least one of the information storage layer, the pinned layer and the free layer has a synthetic antiferromagnetic (SAF) structure.

10. The magnetic memory device of claim 9, wherein the information storage layer has the SAF structure.

11. The magnetic memory device of claim 9, wherein the pinned layer has the SAF structure.

12. The magnetic memory device of claim 9, wherein the free layer has the SAF structure.

13. The magnetic memory device of claim 9, wherein the SAF structure comprises a first ferromagnetic layer, an intermediate layer, and a second ferromagnetic layer sequentially stacked.

14. The magnetic memory device of claim 13, wherein the intermediate layer comprises any one selected from the group consisting of Ru, Cr, and Cu.

15. The magnetic memory device of claim 8, wherein the first and second non-magnetic layers are formed of MgO.

16. The magnetic memory device of claim 7, wherein the antiferromagnetic layer has a switch structure.

17. The magnetic memory device of claim 7, further comprising:
   a bit line, an interlayer insulating layer, and a write line sequentially formed on the free layer.

18. The magnetic memory device of claim 7, further comprising:
   a magnetic layer formed on the free layer and including at least two domains whose magnetization directions are different from each other.

19. An information writing and reading method for a magnetic memory device including a pinned layer, an information storage layer and a free layer formed on a lower structure, the method comprising:
   writing information to the information storage layer after setting a magnetization direction of the free layer in a direction opposite to a magnetization of the pinned layer; and
   reading information from the information storage layer after setting the magnetization direction of the free layer in the same direction as a magnetization of the pinned layer.

20. The method of claim 19, wherein the magnetic memory device includes a writing line arranged on the free layer, the magnetization direction of the free layer being changed according to a magnetic field generated by a current applied to the writing line.

21. The method of claim 19, wherein the magnetic memory device includes a magnetic layer arranged on the free layer, the magnetic layer including at least two domains having different magnetization directions, the magnetization direction of the free layer being changed after moving a domain wall of the magnetic layer.

22. A method of driving a magnetic memory device including a pinned layer, an information storage layer, and a free layer to write and read information, the method comprising:
   writing information to the information storage layer by aligning magnetization of the free layer in a direction opposite to a magnetization direction of the pinned layer; and
   reading information from the information storage layer by aligning the magnetization of the free layer in a same direction as the magnetization direction of the pinned layer.

23. The method of claim 22, wherein the magnetic memory device further includes a write line formed on the free layer, the method further comprising:
   changing the magnetization direction of the free layer due to a magnetic field generated by current supplied to the write line.

24. The method of claim 22, wherein the magnetic memory device further includes a magnetic layer formed on the free layer and including at least two domains whose magnetization directions are different from each other, the method further comprising:
   changing the magnetization direction of the free layer after moving a domain wall of the magnetic layer.

25. The method of claim 22, wherein one of the pinned layer and the free layer has an SAF structure.

26. The method of claim 25, wherein the SAF structure includes a first ferromagnetic layer, an intermediate layer, and a second ferromagnetic layer.

* * * * *